(12) United States Patent
Woodward et al.

(10) Patent No.: US 8,472,806 B2
(45) Date of Patent: Jun. 25, 2013

(54) SYSTEMS AND METHODS FOR PHOTONICALLY ASSISTED RF FILTERING

(75) Inventors: Ted Woodward, Holmdel, NJ (US);
Thomas Banwell, Howell, NJ (US);
Ronald Charles Menendez, Chatham, NJ (US)

(73) Assignee: Telcordia Technologies, Inc., Piscataway, NJ (US)

( * ) Notice: Subject to any disclaimer, the term of this patent is extended or adjusted under 35 U.S.C. 154(b) by 1375 days.

(21) Appl. No.: 12/109,047

(22) Filed: Apr. 24, 2008

(65) Prior Publication Data
US 2009/0036077 A1 Feb. 5, 2009

Related U.S. Application Data

(60) Provisional application No. 60/926,051, filed on Apr. 24, 2007.

(51) Int. Cl.
*H04B 10/00* (2006.01)
(52) U.S. Cl.
USPC .......................................................... 398/115
(58) Field of Classification Search
USPC .......................................................... 398/115
See application file for complete search history.

(56) References Cited

U.S. PATENT DOCUMENTS

| | | | |
|---|---|---|---|
| 4,742,576 A | 5/1988 | McMahon | |
| 5,173,794 A | 12/1992 | Cheung et al. | |
| 5,347,392 A | 9/1994 | Chen et al. | |
| 5,440,415 A | 8/1995 | Mekawi et al. | |
| 5,715,075 A | 2/1998 | Tanaka et al. | |
| 6,407,846 B1 | 6/2002 | Myers et al. | |
| 6,766,116 B2* | 7/2004 | Webb | 398/196 |
| 6,845,108 B1* | 1/2005 | Liu et al. | 372/20 |
| 7,253,943 B2* | 8/2007 | Kim et al. | 359/326 |
| 7,636,525 B1* | 12/2009 | Bontu et al. | 398/208 |
| 8,135,288 B2* | 3/2012 | Franklin | 398/196 |
| 2006/0239695 A1* | 10/2006 | Sayyah | 398/161 |
| 2007/0009205 A1* | 1/2007 | Maleki et al. | 385/27 |
| 2007/0153887 A1* | 7/2007 | Tate et al. | 375/224 |
| 2007/0212070 A1* | 9/2007 | Farmer et al. | 398/67 |
| 2009/0169213 A1* | 7/2009 | Lowery et al. | 398/98 |
| 2009/0297155 A1* | 12/2009 | Weiner et al. | 398/115 |
| 2010/0092183 A1* | 4/2010 | Kim et al. | 398/183 |

OTHER PUBLICATIONS

Zheng et al; optical interference suppression using MicroPhotonic RF filter structure; ECU publications Pre 2011.*

(Continued)

*Primary Examiner* — Kenneth N Vanderpuye
*Assistant Examiner* — Amritbir Sandhu
(74) *Attorney, Agent, or Firm* — Philip J. Feig

(57) ABSTRACT

Systems and methods for improved photonically-assisted RF filtering. Presently, processing of wide-band RF signals involves the use of multiple specialized equipment to isolate a region of interest from the spectrum. The present invention discloses the use of a modulation system to upconvert the RF signal onto the sideband of a light source such as a laser, an optical filter sub-system comprising a plurality of filtering units that function as combinations of IIR and FIR filters, and a resonant channelizing filter for noise reduction and rejection of undesired channels, and means for control and agility of a piecewise coherent optical filter. The resulting filtered RF signal may then be downconverted to the electrical domain for further signal processing.

26 Claims, 5 Drawing Sheets

OTHER PUBLICATIONS

Agarwal et al; optically filtered microwave photonic links for RF Signal processing applications; Jopurnal of lightwave technology, vol. 29, No. 16, Aug. 15, 2011; pp. 2394-2401.*

Minasian et al; Photonic signal processing of microwave signals; IEEE transactions of microwave theory and techniques vol. 54 No. 2, Feb. 2006; pp. 832-846.*

Capmany et al; A tutorial on microwave photonic filters;Jan. 2006; Journal of lightwave technology, vol. 24 No. 1; pp. 201-229.*

Chan et al; Photonic notch filter without optical coherence limitations; Jul. 2004; Journal of lightwave technology, vol. 22, No. 7; pp. 1811-1817.*

Wang et al; All-optical microwave bandpass filters implemented ina Radio-Over-Fiber link; Aug. 2005; IEEE photonics technology letters, vol. 17 No. 8; pp. 1737-1739.*

Agarwal et al; optically filtered microwave photonic links fro RF signal processign applications; Aug. 2011; Journal of lightwave technology, Vo. 29, No. 16; pp. 2394-2401.*

Banwell et al; multiscale sampling for wide dynamic range electro-optic receivers; 2008; optical society of America; pp. 1-3.*

Minasian et al; photonic signal processing of microwave signals; Feb. 2006; IEEE transactions on microwave theory and techniques vol. 54 No. 2; pp. 832-846.*

Banwell, T., et al., "Analytical expression for large signal transfer function of an optically filtered analog link". Optics Express, vol. 17, No. 18, Aug. 31, 2009.

Minasian, R., "Photonic Signal Processing of Microwave Signals." IEEE Transactions on Microwave Theory and Techniques, vol. 54, No. 2, Feb. 2006.

Capmany, J., "A Tutorial on Microwave Photonic Filters." Journal of Lightwave Technology, vol. 24, No. 1, Jan. 2006.

Agarwal, A., et. als. "Multiscale Sampling for Wide Dynamic Range Electro-optic Receivers." Conference on Optical Fiber Communication, San Diego, CA, Mar. 22-26, 2009, p. 1-3.

International Search Report, dated Jul. 1, 2008 (2 pages).

* cited by examiner

SYSTEMS AND METHODS FOR PHOTONICALLY ASSISTED RF FILTERING

CROSS REFERENCE TO RELATED APPLICATION

The present invention claims the benefit of U.S. Provisional Patent Application No. 60/926,051 filed Apr. 24, 2007, the entire content and disclosure of which is incorporated herein by reference.

BACKGROUND OF THE INVENTION

1. Field of the Invention

The present invention relates to signal processing systems and methods. Specifically, the present invention relates to improvements in photonically assisted wide-band RF filtering using optical components.

2. Background of the Invention

RF Signal processing over a wide accessible bandwidth is an unsolved problem. When dealing with filtering 50 MHz resolutions over a range of 10 GHz-200 GHz, individual RF processing components cannot cover this operating range and do not have the agility required for many high-speed filtering applications. FIG. 1 shows a representative wideband RF signal 101 having regions of interest 105.

The conventional method of accessing the information in regions 105 is to digitize a large portion of signal 101 and process it electronically. Present limitations include the bandwidth of the electronics used in the processing apparatus, and the resolution of analog to digital conversion at these speeds, both of which lead to problems as the frequency range gets higher. Further, although the desired bandwidth may be a reasonable fraction of the overall bandwidth, in the analog domain different electronic components are required as the working frequency is changed. For instance, RF components operating at 1 GHz look quite different from RF components operating at 20-60 GHz. A unique setup has to be used for varying ranges, leading to increased cost and complexity.

One present solution involves filtering the signal. An analog operation is performed on this wide RF spectrum, narrowing it to a region of interest, and then processed by the digital signal processor. FIG. 2A shows such a conventional RF front-end filter. The filter has a specific bandwidth it operates on. To work on a different frequency, significant aspects of the filter must be changed.

FIG. 2B shows a system block diagram of an RF signal processing system, and the aspect of the system to which the present invention (dashed area) is applied. Optical processing techniques have previously been discussed as promising ways to address many of the limitations of conventional electronic processing methods. These methods have fallen short due to limitations in performance, including agility, dynamic range, size, weight, power, and ability to realize essential filter functions in a stable manner.

In contrast to conventional RF signal processing systems, in which filter operations can be based on the electric field intensity, optical RF signal processing systems have been long restricted from using electric field-based processing techniques, due to concerns about stability. See, for example: Capmany, J., Ortega, B., Pastor, D., IEEE Jnl. Lightwave Tech., v. 24, no. 1, pp. 201-229, February 2006., and Minasian, R. A., IEEE Trans. Microwave Theory and Techniques, v. 54, no. 2, pp. 832-846, February 2006.), This limitation is a significant shortcoming. Further F shortcomings related to the dynamic range of electrical to optical (E/O) conversions also exist. An improved method and system for photonically assisted RF filtering is needed.

SUMMARY OF THE INVENTION

The present invention describes systems and methods for RF filtering employing integrated optical elements to realize a programmable optical filter that operates on RF signals upconverted to the optical domain with laser light modulation and detected using coherent heterodyne methods. Such a conversion operation transforms a wide-band RF signal processing problem (e.g. baseband 1 GHz to 200 GHz), to a narrowband optical processing problem (e.g. 10 GHz to 200 GHz centered around an optical carrier, such as 1.5 microns or ~193 THz).

In one embodiment, the present invention is an RF filtering system, comprising a modulator subsystem further comprising a light source coupled to a first modulator, the first modulator receiving an RF signal and upconverting the RF signal to the optical domain, a filtering subsystem coupled to the modulator, the filtering subsystem comprising a resonant channelizing filter, and a plurality of filtering units for filtering the upconverted RF signal, each of the plurality of filtering units operating on coherent optical interference effects between diverse optical paths and delays within each element (e.g. piecewise coherent), and a detection subsystem for downconverting the filtered upconverted RF signal from the optical domain to the RF domain. Each of the individually optically coherent elements is connected by a single optical path, thereby removing requirements for coherent control between each element. Each of the plurality of filtering units further comprises a finite impulse response (FIR) element, an infinite impulse response (IIR) element, or both. The optical filtering unit or unit cell can thus be cascaded to realize both pole and zero filter functions (see, for example Madsen, C. K., Zhao, J. H., "Optical Filter Design and Analysis", Wiley, 1999. ISBN 0-471-18373-3.

Additionally, filter center frequency agility is achieved through use of laser tuning. In one embodiment, the frequency of the upconverted RF signal is tuned to the resonant frequency of the filtering subsystem by changing the frequency of the light source.

The plurality of filtering units may further comprise an arrangement of time-delays, phase shifters, and couplers. The properties of each filtering unit can be tuned to multiple characteristic filter resonances, thereby achieving control of the coherent filter array by use of alternative probe wavelengths, filter resonances, and probe insertion and extraction means, as well as dynamic range extension via scaled modulation methods by passing multiple modulated signals through the filter matrix using alternative filter resonances.

Further, the modulator subsystem may comprise a second modulator that generates a target waveform, providing the ability to perform correlation operations between the filtered signal and the desired target waveform through the use of the coherent optical reception process.

In another embodiment, the present invention is an optically coherent filter system with adjustable parameters, comprising a source of a phase-modulated optical signal, a filter cascade comprising a plurality of filtering units, each of the plurality of filtering units further comprising an arrangement of time-delays, phase shifters, and couplers, the time-delay for each unit cell being individually configurable, each of the plurality of unit cells being optically piecewise coherent, and a resonant channelizing filter. Each of the plurality of filtering units further comprises a finite impulse response (FIR) element, an infinite impulse response (IIR) element, or both.

In one embodiment, the optical signal is phase-modulated by an incoming wideband RF signal, such that the resultant phase-modulated optical signal carries an upconverted RF signal. The frequency of the upconverted RF signal is tuned to the resonant frequency of the filtering subsystem by changing the frequency of the source of the optical signal. In another embodiment, the resonant frequency of one of the plurality of filtering units can be tuned to the frequency of the upconverted RF signal by modifying the aforesaid arrangement of phase shifters and couplers with which the signals are routed through the different optical paths in each unit cell.

In yet another embodiment, the present invention is a method for RF filtering, the method comprising modulating an optical signal with an RF signal, such that the modulated optical signal comprises an upconverted RF signal, filtering the upconverted RF signal through a plurality of filtering units, each of the plurality of filtering units further comprising an arrangement of time-delays, phase shifters, and couplers, said plurality of filtering units further having a filter center frequency $\omega_F$ and being piecewise coherent, and downconverting the upconverted RF signal into the RF frequency domain. An additional step may include passing the filtered upconverted RF signal through a resonant channelizing filter, said resonant channelizing filter having a free spectral range greater than the free spectral range of the plurality of filtering units. The filter center frequency (OF may be aligned with the frequency of the RF signal $\omega_{RF}$ by shifting the frequency $\Omega_{RF}$ of the source of the optical signal.

A related embodiment includes passing a plurality of probe signals through the plurality of unit cells, and adjusting the optical path lengths of each of the plurality of filtering units by probing the response to the probe signals. Through the control system, the optical coherence required of the piecewise coherent filter arrangement can be stabilized.

DETAILED DESCRIPTION OF THE INVENTION

The present invention describes systems and methods for RF filtering employing integrated optical elements to realize a programmable optical filter that operates on RF signals upconverted to the optical domain with laser modulation and detected using coherent heterodyne methods. An RF signal is imposed on the filter system through the use of phase modulation of a laser through a first modulator, the effect of which is to create a sideband on the laser and align a region of interest of an incoming RF signal with a resonance of a cascade of optical filter elements characterized by a time delay element and a free spectral range (FSR). The RF signal is shaped and filtered through the action of the cascaded unit cell array as well as a final stage channelizing filter. The final channelizing filter is characterized by a larger FSR.

The ability to create an arbitrary filter function is dependent upon the ability of the array of unit cell filters to operate on the electric field rather than the intensity, which in turn requires the ability to program and control the filter parameters in optical phase. This requirement for stabilization makes the use of an integrated optics technology highly desirable. A high dynamic range is achieved by maximizing the amplitude with which the first modulator can be driven by the incoming RF signal, and by minimizing system noise. Through adjustment of the frequency of the laser, the operating point of the filter may be adjusted without reconfiguring the parameters of the filter itself. Thus, besides cascading filtering units that are optically coherent, modulation and detection elements play an important role in determining the dynamic range of the system. Further, real-time systems to control and stabilize the filtering units are essential.

Figure 1:
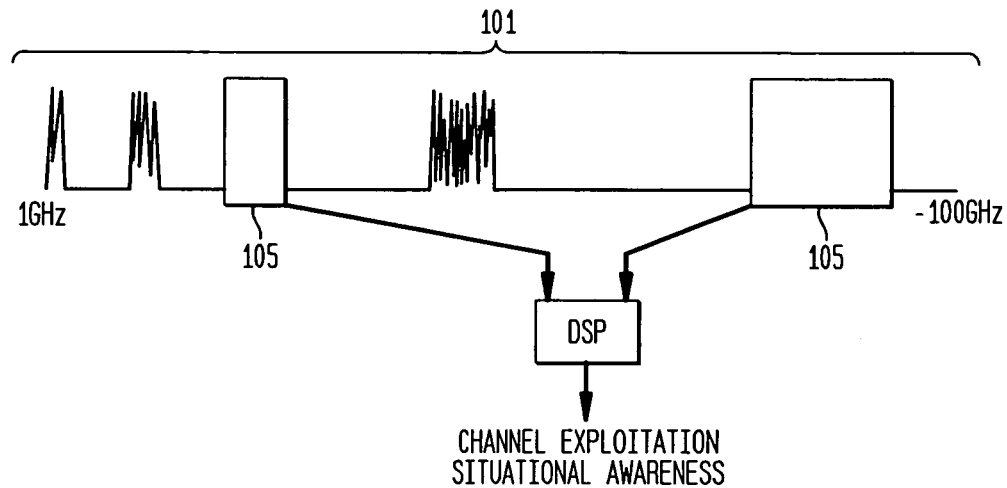
FIG. 1 shows a wideband RF signal having regions of interest, as exists in the prior art.
Figure 2A:
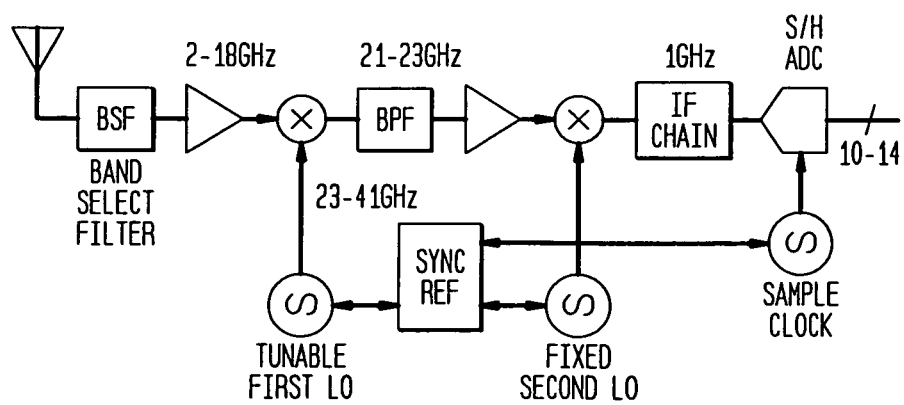
FIGS. 2A and 2B show a systems block diagram of an RF signal processing applications (2B), with the RF filtering front end region of interest illustrated by the dashed line and a conventional (e.g. non-optical) solution to the RF filtering front end (2A), according to the prior art.
Figure 2B:
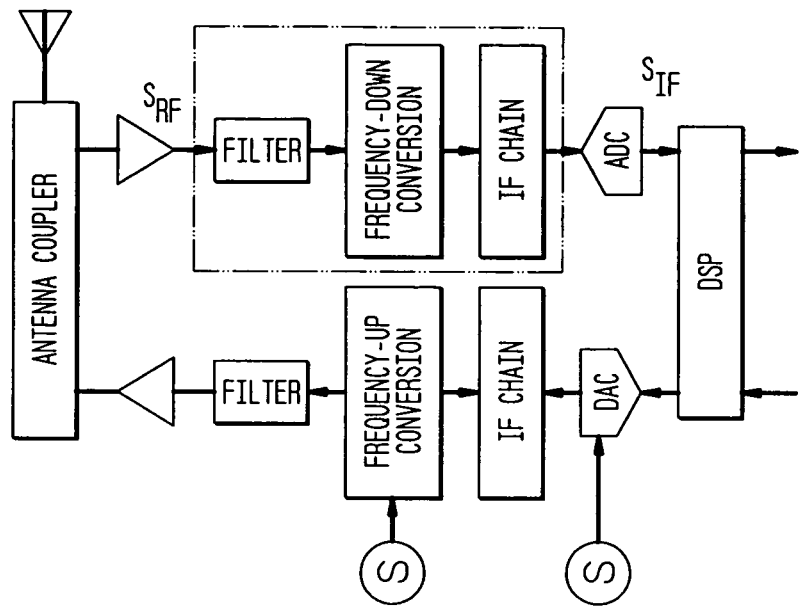
Figure 3:
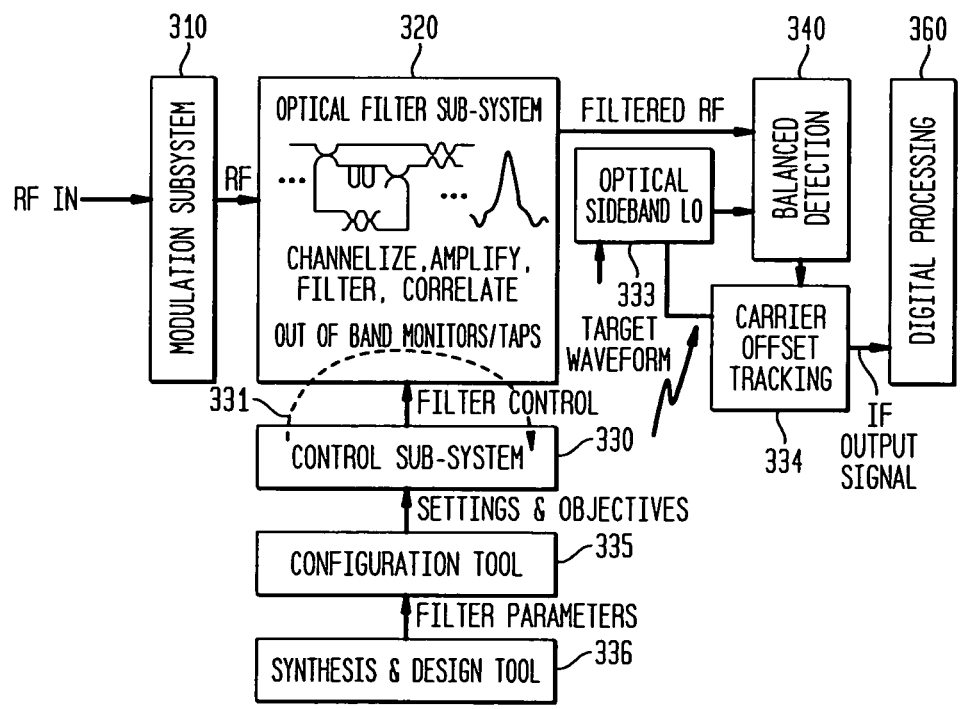
FIG. 3 shows an overview of a photonically-assisted RF filtering system, according to an exemplary embodiment of the present invention.

FIG. 3 shows an overview of an RF filtering system, according to an exemplary embodiment of the present invention. An RF signal enters a modulation sub-system 310. Modulation sub-system 310 imposes the RF signal on an optical signal, upconverting the RF signal into the optical domain. Modulation subsystem is coupled to an optical filter sub-system 320, which is responsible for signal channelization, RF spectral shaping, and correlation filtering. A control sub-system 330 is used to control tunable elements of the optical filter sub-system. Further, a configuration tool 335 is coupled to the control sub-system 330, and a synthesis and design tool 336. Tools 335-336 provide presets and user-defined parameter adjustments for improved dynamic control of the optical filter sub-system 320. The filtered upconverted RF signal then enters the detection subsystem 340. The filtered upconverted RF signal is downconverted, or coupled with a target waveform generated by a local oscillator (LO) 333 that is aligned to the modulation source by a carrier offset tracking unit 334. Eventually the downconverted and filtered RF signal undergoes other digital processing 360.

The filter sub-system acts in harmony with the modulation, filtering, and detection sub-systems, because the filtering function itself is not realized until the individual impulse response is extracted in the detection sub-system. There is a relationship between the filter matrix and the modulation/detection system through the noise suppression and injection properties of the filter subsystem, and the range and type of filtering coefficients that can be realized for a given level of optical coherence and type of modulation. Because relative optical phase variation is critical to the operation of a given filtering unit, and because coherent heterodyne detection is used for noise suppression and sensitivity enhancement, a real-time closed loop control system is essential to stable operation of the filter subsystem.

Figure 4:
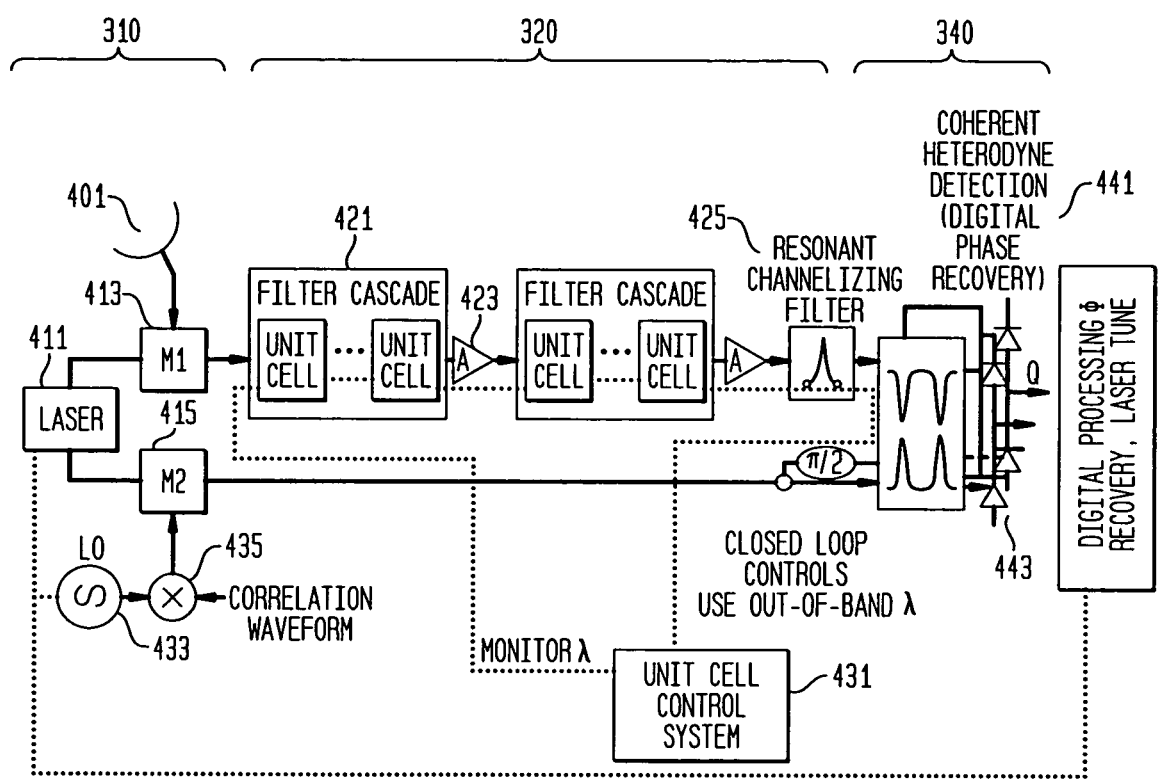
FIG. 4 shows the elements of a cascading filter subsystem within a photonically-assisted RF filtering system, according to an exemplary embodiment of the present invention.

Thus, in one embodiment, a control signal 331 is used to monitor the status of the filter subsystem and maintain desired characteristics. The filter synthesis tool 336 determines the expected values of the observable signals, in addition to providing appropriate coefficient values to the filter components to realize a desired filter transfer characteristic. To overcome limitations in the reconfiguration rate of the filter system, we employ tunability in the modulation sub-system 310, and a novel modulation-based correlation technique described after the structural description below. F FIG. 4 shows the elements of a cascading filter subsystem within a photonically-assisted RF filtering system, according to an exemplary embodiment of the present invention. The modulation sub-system 310 comprises a light source 411 and a first modulator 413, as well as an antenna subsystem 401 that receives a RF signal. The antenna 401 is part of an RF reception system that is not shown but may comprise a series of electrical elements including antennae, receivers, and amplifiers. The incoming RF signal drives modulator 413 while light source 411 also goes through modulator 413. Light source 411 is a tunable low phase noise laser, such as an external cavity or DFB laser. Modulator 413 modulates the RF signal onto a sideband of the light source. Thus, the RF signal is upconverted to the optical domain. In an exemplary embodiment, a second modulator 415 is included, so that modulators 413 and 415 in FIG. 4 can be considered as two discrete emitters that are closely spaced in optical frequency.

At moderately low RF frequencies (<10 GHz), the RF signal from 401 can be converted to an optical side band by frequency modulating a DFB laser with a potential reduction in total power consumption and improved integration opportunity. FM modulated DFB devices involve the use of two distinct lasers. A Mode Locked Laser (MLL) is attractive option for light source 411 as it can provide very high frequency effective local oscillator (LO) modulation by driving modulator 413 with one of the comb signals that make up the MLL spectrum, and driving modulator 415 with a distinct frequency peak of the frequency comb that may be many tens or even hundreds of GHz away. Since each comb is frequency locked to each other, this provides a novel mechanism for operating at very high RF frequencies at which oscillators are not readily available and for which phase locking circuitry is difficult or non-existent.

The modulation sub-system 310 is coupled to a filtering sub-system 320. The optical signal bearing the upconverted RF signal is supplied to a filter subsystem consisting of a plurality of cascades 421 of filtering units, shown as unit cells, amplifiers 423, and a discrete channelizing element 425 having a wide free spectral range (FSR) capable of very high resolution. The filtering units 421 are optical filters comprising a plurality of time delays, phase shifters, and couplers. These are further described in FIG. 5. In the present case, there is a need to carve out a section of the signal in which we are interested and in the simplest case, just pass that signal with high fidelity through to the detection system, rejecting the unwanted signal components. This is the benefit of implementing this analog front end. As mentioned herein, prior methods involved converting the entire signal to digital and then throwing away 90% of it. The optical filter array performs the signal channelization activity before any further signal processing. To realize the filter one may implement a plurality of finite impulse response (FIR) or infinite impulse response (IIR) elements, and the filter cascade is intended to reflect a cascade of FIR or IIR filter elements that can be used together to create a desired filter line shape. Each filtering unit may comprise identical components but can be programmed differently. The crucial characteristic of a finite impulse response is the delay; this is created by taking a signal and a delayed copy of the signal and interfering them together. The delay is one of the factors that defines the free spectral range (FSR) of the filter. The description of FIG. 5 will shed more light on programming filtering units. Amplification elements 423 boost the optical signal to account for loss arising from propagation or interference in the unit cell array, and may be introduced as required to maintain required signal-to-noise ratio. F Several possible methods of amplification may be provided according to well-known methods such as Erbium-doped fiber or waveguide amplifiers, parameteric optical amplification, Raman amplification, or semiconductor optical amplification.

A composite of the channelizing filter 425 and unit cell array 421 is required to realize the desired filter shape, because the channelizing filter 425 itself does not provide sufficient flexibility or resolution. The resonant channelizing filter 425 is an infinite impulse response (IIR) element that may be realized in one of several methods in which signals are coupled to a resonant element which achieves a high throughput on resonance and a low transmission off resonance. Such filters, well known in the art of optical devices, are characterized by a finesse and a 'q' value that are determined by the geometry of the device and its loss. Such devices can be constructed to realize narrow band-pass filters that we refer to as resonant channelizing filters. Small (10-100 um) structures can have FSR ~100-1000 GHz and provide the desired rejection of unnecessary resonances of the more tightly spaced FSR arising from longer time delays in the arrays of filter elements. Exemplary devices realized by ring resonators are described elsewhere (see, for instance, Madsen, C. K., Zhao, J. H., "Optical Filter Design and Analysis", Wiley, 1999 ISBN 0-471-18373-3). Where the unit cell itself is an arrangement of time delays and couplers configured to realize feed-forward or feedback signal flow (see FIG. 5), the channelizing filter 425 will provide rejection of all but the primary unit cell resonance. Several advantageous features follow from the use of this channelizing filter 425. First, a FSR >200 GHz is readily achievable, which assures that no aliasing issues will arise over a wideband (10 GHz-200 GHz) RF bandwidth. Second, the narrowband optical filtering behavior of the channelizer 425 can be used to significantly restrict noise admitted to the detection sub-system 340, since it will greatly attenuate noise introduced to the system from amplifier elements (423). Finally, side lobe suppression can be enhanced relative to using unit cell arrays alone.

After filtering the upconverted RF signal through the optical subsystem, signals are downconverted directly to baseband in a detection system 340. To maximize the dynamic range of the system, a coherent heterodyne detection technique 441 using a balanced receiver is employed. This will both assist in the suppression of common mode noise as well as improve detection sensitivity.

The Unit Cell control system 431 is part of control sub-system 330 that relies on monitor wavelengths. Second modulator 415 is used to drive the detection sub-system, where element 441 is intended to illustrate a hybrid coupler that mixes the LO signal with the filtered signal, and splits them equally between two detection diodes 443. The function being performed here is a coherent heterodyne detection in the optical domain, akin to that which is done in RF domains, creating a coherent optical receiver, familiar to those skilled in the art of optical communication systems.

Figure 5:
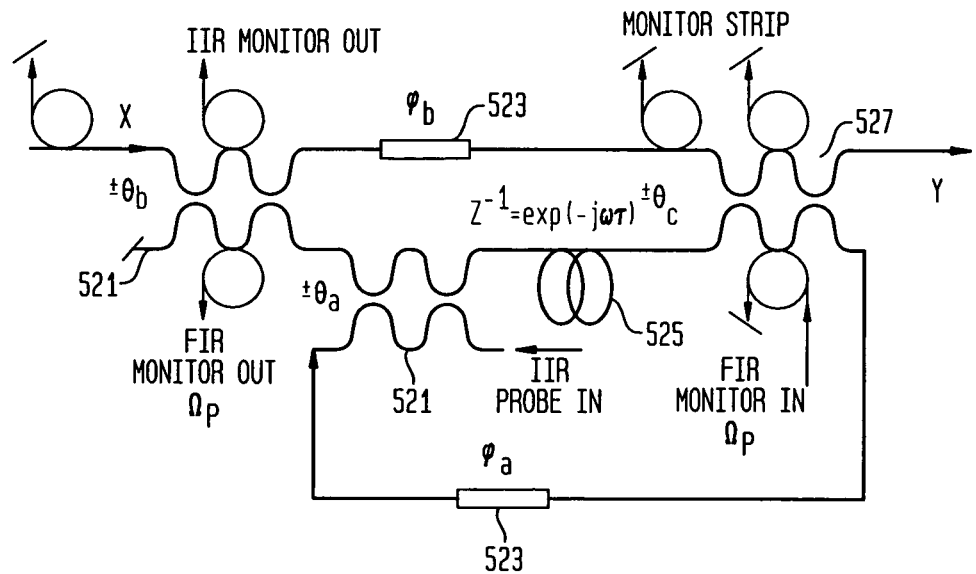
FIG. 5 shows the elements of a filtering unit cell, according to an exemplary embodiment of the present invention.

FIG. 5 shows the elements of a filtering unit cell, according to an exemplary embodiment of the present invention. A phase-modulated optical signal enters at X and is split by a tunable coupler 521, whose tunability is indicated with variable $\theta_b$. Some of the signal goes through element 523, which is a phase shifter with tunable element $\phi_b$. $Z^{-1}$ coils 525 illustrate a time delay element, realized, for example, with monolithic waveguide. The two split signals are then recombined tunable coupler 527, whose tunability is indicated with variable $\theta_c$. The signal is output at Y and routes to the next element.

Basically, the optical signal is split, part of it is delayed, and then interfered together. The conditions for destructive interference are controlled with the phase difference between the different paths. Elements 521 and 527 are the couplers/splitters. Elements 523 and 524 are phase shifters. By adjusting ($\phi_b$, $\theta_b$ and $\theta_c$), one can control the amount of interference generated and the specific optical frequency and phase of destructive interference, i.e. the operating point of the filter. The delay element 525 determines the FSR of the filtering unit or the frequency at which filter resonances are repeated. The FSR is characterized by the inverse of the time delay value.

The filtering unit can be configured as a FIR or IIR filter, thus generating a combination of poles and zeros. The plurality of filtering units can thus provide any combination of such filters. Note here that this operates on the electrical field. Piecewise optical coherence is provided because each filtering unit is operating on optical coherence within each unit— wherever the optical paths are split from each other.

Because of the requirement for stabilization to fractions of an optical wavelength, coherent optical filters have been discouraged for their sensitivity to uncontrolled environmental effects such as temperature. The present invention alleviates this sensitivity through integration and closed loop control systems. A composite of the channelizing filter and unit cell array is required to realize the desired filter shape, because the channelizing filter itself may not provide sufficient flexibility or resolution. The unit cell itself is an arrangement of time delays and couplers configured to realize feed-forward or feedback signal flow, or some combination thereof. Path gains may be controlled using Mach-Zehnder elements that can be prescriptively tuned.

A key variable fixing the scale of the filter is the value of the time delay $\tau$. For the present program, the time delay can be determined from the required filter bandwidth (for example, 50 Mhz), allowable tap range (64), required rejection ratio (60 dB), the propagation loss through the integrated waveguide structures used to realize the elements, and the FSR of the channelizing filter 425. Taking these values into account, time delays in the 200 to 800 ps range are optimal. The transfer function depends critically on the optical phase in the unit cell, leading to a coherent optical filter with complex coefficients. Since it is only within a given unit cell that optical paths differ from one another, control of relative optical path difference within each unit cell will affect an overall coherent optical filter. Such 'segmented coherence' will make coherent optical filtering realizable and controllable in an extended filter matrix. To achieve it, closed loop interferometric control of each unit cell will be required, which implies a monitoring function capable of tracking phase changes in the unit cell non-invasively to the signals flowing through it. Here it is possible to employ high performance, compact, ring resonator structures suitable for insertion and removal of 'pilot tone' monitor signals or with individual frequency tones on a single wavelength. These control signals may be advantageously routed through alternative resonances of the filter.

One of the primary desirable potential advantages of optically driven RF signal processing is the potential for tunable ultra-wide-band RF signal processing. The possibility arises from the narrowband nature of the upconverted signal relative to the optical carrier, as mentioned herein. There are appropriate time constants associated with the operation of the optical filter that dictate where and how agility should be provided. For high speed agility demands, it may be best not to adjust the filter matrix, but rather the stimulus and response elements of the filter system that surround the filter matrix. Complex reconfiguration of filter matrix or correlation functions take place at more modest rates typical of 'reprovisioning' operations. Thus, while filter matrix reconfiguration is an option, it need not be the first option. Given the complex nature of the filter control and stabilization system, frequent adjustments of the filter matrix may be undesirable, due to convergence or stability problems. Thus, the present invention provides for novel methods to achieve filtering agility without the necessity of high-speed filter matrix reconfigurations.

Figure 6:
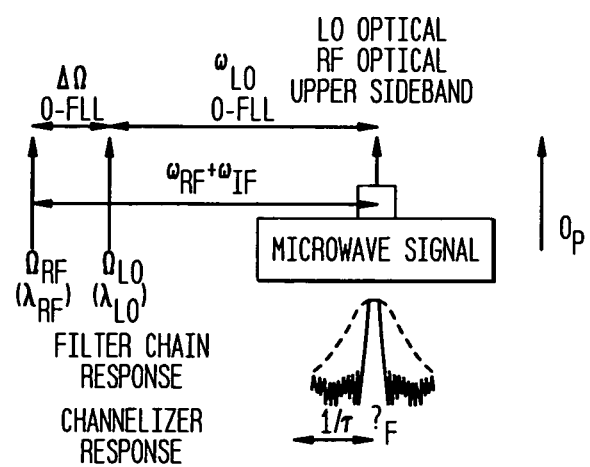
FIG. 6 shows the relationship between optical frequencies and RF signals of the tunable RF filtering system, according to an exemplary embodiment of the present invention.

Filter Center Frequency Agility may be achieved by tuning the laser source used to upconvert the incoming RF signal. FIG. 6 shows the correlation between tunable frequencies of an RF filtering system, according to an exemplary embodiment of the present invention. The filter center frequency (fixed at $\omega_F$) will align with the desired RF center frequency ($\omega_{RF}$) when $\Omega_{RF}+\omega_{RF}=\omega_F$. Thus, by shifting the frequency of the optical carrier an amount equal to the desired filter tuning range, the RF operating frequency of the filter can be shifted. This process of modulating the RF filter center frequency is a direct consequence of the narrow-band nature of RF photonic processing previously mentioned, and is one of the strongest motivators for photonically assisted RF signal processing.

Modulation Based Correlation: If a Local Oscillator (LO) is imposed on the heterodyne modulator 325, downconversion is achieved and the RF signal is converted to baseband. However, if a desired template is imposed on modulator 325, downconversion at the photodiode produces a signal that is maximized when the template and the filtered optical signal match. The advantage of this "Modulation-based Correlation" method is that the speed of C the correlation operation is limited only by the rate at which the correlation templates can be cycled onto the modulator and the speed of the detector. By contrast, performing correlation functions through the use of subsequent filter stages requires a reconfiguration of correlation filter, an operation that may be constrained due to physical limitations of the technology used to realize the filter itself.

Figure 7:
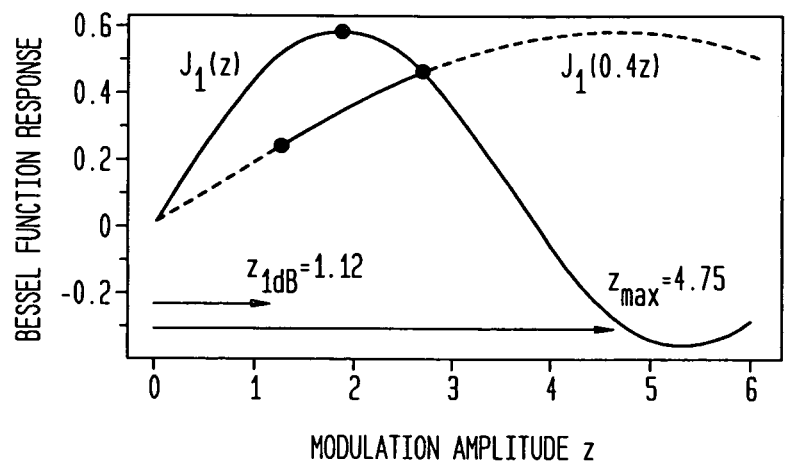
FIG. 7 shows the phase modulation response function operated at two modulation amplitude scales (z, and 0.4z), according to an exemplary embodiment of the present invention.

System linearity limits the ability to recover small signals in the presence of large amplitude interference. If the transfer function of a modulator is known, its response can be numerically inverted to effectively linearize the behavior of the modulator, as described below. Phase modulation (PM) is an effective method to create an optical sideband from an RF signal for use in coherent optical signal processing. The sideband amplitude is given by $y=J_1(z)$ for a sinusoidal modulation amplitude z, nearly independent of the hardware implementation, where $J_1(z)$ is the first order Bessel function. FIG. 7 illustrates the behavior of $J_1(z)$. The linear range extends from z=0 to about z=1.12 (1 dB gain compression). The corresponding two tone input third order intercept is $IIP_3^2=\sqrt{4k_3/3k_1}=3.2$. This typically yields an SFDR=49 dB for a 50 MHz noise bandwidth. The distortion is well defined by the properties of $J_1(z)$ and can be mitigated using pre-distortion or using digital signal processing (DSP) to solve $y=J_1(z)$ for z after detection. The inversion of $J_1(z)$ is limited to regions for which the slope $d/dz J_1(z) \neq 0$, such as z<1.8 in FIG. 7. A second measurement of the RF signal can be used to remove the ambiguity in $J_1(z)$. Our method bridges the region around z=1.8 with vanishing derivative using a second measurement of the RF signal with a scaled response $\tilde{y}=J_1(0.4z)$. The vector function $(y,\tilde{y})=(J_1(z), J_1(0.4z))$ can be inverted for all z<4.75, which provides a ~10 dB improvement in useable dynamic range. Such an operation is enabled through the use of multiple filter resonances evident in FIG. 6, which may be advantageously spaced relatively closely together in frequency space due to the FSR of the cascade of filter elements. The close spacing of filter resonances is necessary so that system response can be assumed constant for the two scaled modulation signals.

Figure 8:
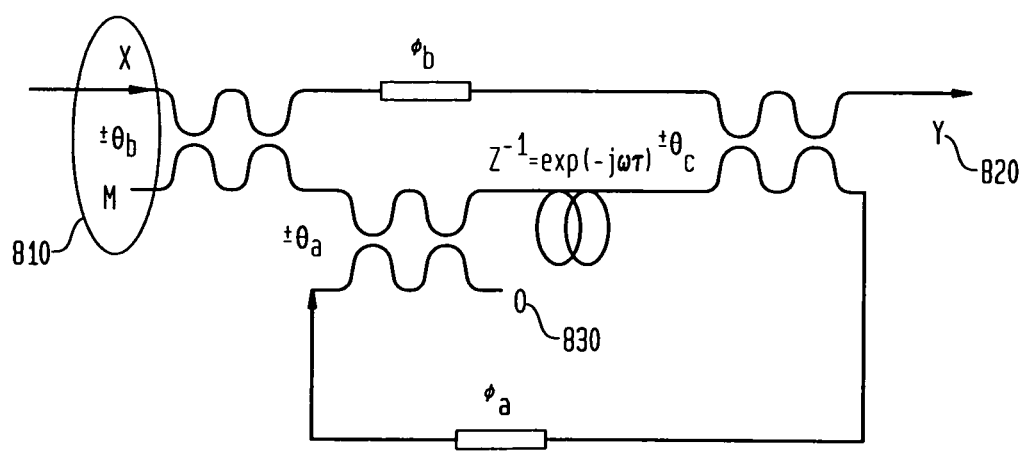
FIG. 8 shows the elements of a filtering unit cell indicating all potential input and output ports, according to an exemplary embodiment of the present invention.

FIG. 8 shows the elements of the filtering unit cell of FIG. 5, indicating all potential input and output ports, according to an exemplary embodiment of the present invention. The filtering element in FIG. 8 has two possible inputs (X and M in 810) and two possible outputs (Y in 820 and O in 830). Either of the two inputs or outputs can be employed to source signals into or out of the element and still maintain the piecewise coherence of the array. FIGS. 5 and 8 illustrate one example, but other examples are possible. Depending on the application and filter configuration (e.g. FIR or IIR), different ports may be preferred for input and output. For example, for an IIR condition, it can be shown with standard techniques that reduced waveguide loss is obtained when output is taken from port O (830).

The present invention also provides for software tools for filter reconfiguration. A filter synthesis is provided, which is a tool capable of determining the realizability and appropriate unit cell configuration parameters for a given filter transfer function. This tool treats the optical filter synthesis problem similarly to the way digital filter design is currently treated in commercial and open source RF filter design tools. These tools (e.g. FIRLS from MATLAB) generate the appropriate (complex) filter weights required in an array of otherwise identical cells necessary to realize a desired filter lineshape. The proposed optical filter synthesis tool will perform a similar function for the array of optical filter elements. The synthesis tool will be important to determine the appropriate settings for all the control variables of the unit cell array, and also to determine the stability of the filter against variations in these parameters (e.g. a sensitivity analysis).

Additionally, a real-time control system is provided that is capable of maintaining the predicted filter lineshape in a real operating environment. Given a potentially large number of filter elements, each with 4 distinct phase adjustments, imposes the requirement of interferometric stability to maintain the complex filter coefficients required for high performance filtering. Closed loop control will be essential, as will tight integration with control electronics. Each unit cell requires at least two control monitor signals. The task can be made much simpler if a smaller subset of observable parameters can be identified such a smaller set of observables can be tracked and remaining variables allowed to automatically converge against the desired filter function.

While preferred embodiments of the present invention have been described using specific terms, such description is for illustrative purposes only, and it is to be understood that changes and variations may be made without departing from the spirit or scope of the following claims.

What is claimed is:

1. An RF filtering system, comprising:
a modulator subsystem comprising a light source coupled to a first modulator, the first modulator receiving an RF signal and upconverting the RF signal to the optical domain;
a filtering subsystem coupled to the modulator, the filtering subsystem comprising a resonant channelizing filter, and a plurality of filtering units for filtering the upconverted RF signal, each of said plurality of filtering units operating on coherent optical interference effects between diverse optical paths and delays within each element; and
a detection subsystem for downconverting the filtered upconverted RF signal from the optical domain to the RF domain.

2. The system of claim 1, wherein the plurality of filtering units interconnect to one another through a single optical path.

3. The system of claim 1, wherein each of the plurality of filtering units further comprises an finite impulse response (FIR) element, an infinite impulse response (IIR) element, or both.

4. The system of claim 3, wherein each of the plurality of filtering units further comprises at least two inputs and at least two outputs.

5. The system of claim 3, wherein the frequency of the upconverted RF signal is tuned to the resonant frequency of the filtering subsystem by changing the frequency of the light source.

6. The system of claim 3, wherein each of said plurality of filtering units further comprises an arrangement of time-delays, phase shifters, and couplers.

7. The system of claim 6, wherein the resonant frequency of one of the plurality of filtering units can be tuned to the frequency of the upconverted RF signal by adjustment of the couplers and phase shifters.

8. The system of claim 6, further comprising a probe signal to monitor the status of the filter subsystem and maintain desired characteristics, the response to said probe signal being used to adjust the phase shifters.

9. The system of claim 3, wherein the resonant channelizing filter has a wider free spectral range than the free spectral range of the filtering units.

10. The system of claim 3, wherein the time delay for a filtering unit is within the 200-800 ps range.

11. The system of claim 3, wherein the detection subsystem further comprises a local oscillator.

12. The system of claim 3, wherein the modulator subsystem further comprises a second modulator that generates a target waveform, said target waveform being correlated with the upconverted RF signal before reaching the detector subsystem.

13. The system of claim 3 wherein the first light source is a mode-locked laser.

14. The system of claim 6, wherein the phase shifters are operated under closed loop control.

15. The system of claim 1, wherein multiple filter resonances are employed for operation and control of the filter system.

16. An optically coherent filtering sub-system with adjustable parameters, comprising:
a source of an optical signal;
a filter cascade comprising a plurality of filtering units, each of said plurality of filtering units further comprising an arrangement of time-delays, phase shifters, and couplers, said time-delay for each unit cell being individually configurable, each of said plurality of unit cells being optically piecewise coherent operating on coherent optical interference effects between diverse optical paths and delays within each element; and
a resonant channelizing filter.

17. The sub-system of claim 16, wherein each of the plurality of filtering units further comprises a finite impulse response (FIR) element, an infinite impulse response (IIR) element, or both.

18. The sub-system of claim 16, wherein each of the plurality of filtering units further comprises at least two inputs and at least two outputs.

19. The sub-system of claim 16, wherein the optical signal is phase-modulated by an incoming wideband RF signal, such that the resultant phase-modulated optical signal carries an upconverted RF signal.

20. The system of claim 19, wherein the frequency of the upconverted RF signal is tuned to the resonant frequency of the filtering subsystem by changing the frequency of the source of the optical signal.

21. The system of claim 19, wherein the resonant frequency of one of the plurality of filtering units can be tuned to the frequency of the upconverted RF signal by adjustment of the couplers and phase shifters.

22. A method for RF filtering, the method comprising:
modulating an RF signal on an optical signal, such that the modulated optical signal comprises an upconverted RF signal;
filtering the upconverted RF signal through a plurality of filtering units, each of said plurality of filtering units further comprising an arrangement of time-delays, phase shifters, and couplers, said plurality of filtering units further having a filter center frequency $\omega_F$ and being piecewise coherent operating on coherent optical interference effects between diverse optical paths and delays within each element; and
downconverting the upconverted RF signal into the RF frequency domain.

23. The method of claim 22, further comprising:
passing the filtered upconverted RF signal through a resonant channelizing filter, said resonant channelizing filter having a free spectral range greater than the free spectral range of the plurality of filtering units.

24. The method of claim 22, further comprising:
aligning the filter center frequency $\omega_F$ with the frequency of the RF signal $\omega_{RF}$ by shifting the frequency $\Omega_{RF}$ of the source of the optical signal.

25. The method of claim 22, further comprising:
passing a plurality of probe signals through the plurality of unit cells; and
adjusting the optical path lengths of each of the plurality of filtering units by probing the response to the probe signals.

26. The method of claim 24, further comprising tuning the resonant frequency of one of the plurality of filtering units to the frequency of the upconverted RF signal by adjustment of the couplers and phase shifters.

* * * * *

UNITED STATES PATENT AND TRADEMARK OFFICE
CERTIFICATE OF CORRECTION

PATENT NO. : 8,472,806 B2  
APPLICATION NO. : 12/109047  
DATED : June 25, 2013  
INVENTOR(S) : Woodward et al.

Page 1 of 1

It is certified that error appears in the above-identified patent and that said Letters Patent is hereby corrected as shown below:

On the Title Page

On Page 2, in item (56), under "OTHER PUBLICATIONS", in Column 1, Line 2, delete "Jopurnal" and insert -- Journal --, therefor.

On Page 2, in item (56), under "OTHER PUBLICATIONS", in Column 1, Line 12, delete "ina" and insert -- in a --, therefor.

On Page 2, in item (56), under "OTHER PUBLICATIONS", in Column 1, Line 15, delete "fro" and insert -- for --, therefor.

On Page 2, in item (56), under "OTHER PUBLICATIONS", in Column 1, Line 16, delete "processign" and insert -- processing --, therefor.

In the Specification

In Column 1, Line 66, delete "Further F" and insert -- Further --, therefor.

In Column 5, Line 5, delete "below. F" and insert -- below. --, therefor.

In Column 6, Line 4, delete "F Several" and insert -- Several --, therefor.

In Column 8, Line 34, delete "C the" and insert -- the --, therefor.

Signed and Sealed this  
Thirty-first Day of March, 2015

Michelle K. Lee  
*Director of the United States Patent and Trademark Office*